United States Patent

Eger

[15] 3,642,548

[45] Feb. 15, 1972

[54] METHOD OF PRODUCING INTEGRATED CIRCUITS

[72] Inventor: Helmut Eger, Olching, Germany

[73] Assignee: Siemens Aktiengesellschaft, Berlin, Germany

[22] Filed: July 15, 1970

[21] Appl. No.: 55,149

[30] Foreign Application Priority Data

Aug. 20, 1969 Germany ......................P 19 42 455.6

[52] U.S. Cl. ......................................156/3, 117/5.5, 156/8, 156/13, 156/17, 204/192

[51] Int. Cl. ......................................C23f 1/00, C23c 15/00

[58] Field of Search ......................156/2, 3, 7, 8, 11, 13, 17; 29/576, 578; 204/192, 298; 117/5.5

[56] References Cited

UNITED STATES PATENTS 3,271,286 9/1966 Lepsetter ............................156/17 X
3,367,806 2/1968 Cullis ......................................156/17
3,442,701 5/1969 Lepsetter ..............................117/212
3,474,021 10/1969 Davidse et al. ........................204/192
3,546,010 12/1970 Gartner et al ........................156/17 X

*Primary Examiner*—Robert F. Burnett
*Assistant Examiner*—R. O. Linker
*Attorney*—Curt M. Avery, Arthur E. Wilfond, Herbert L. Lerner and Daniel J. Tick

[57] ABSTRACT

A semiconductor substrate has platinum contact spots at one surface, a layer of insulating material covering the surface except the contact spots, a titanium layer covers the insulating layer and the contact spots, a platinum layer covers the titanium layer and a gold layer covers a platinum layer. To produce an integrated circuit, a chemically easily etchable metal masking layer is applied to the gold layer. The metal masking layer is chemically etched away except for a desired conductor pattern. The gold layer is etched away and the platinum layer is etched away, other than the desired conductor pattern, by cathode sputtering. The metal masking layer remaining on the desired conductor pattern is etched away and the titanium layer other than the desired conductor pattern is etched away.

9 Claims, 1 Drawing Figure

PATENTED FEB 15 1972 3,642,548
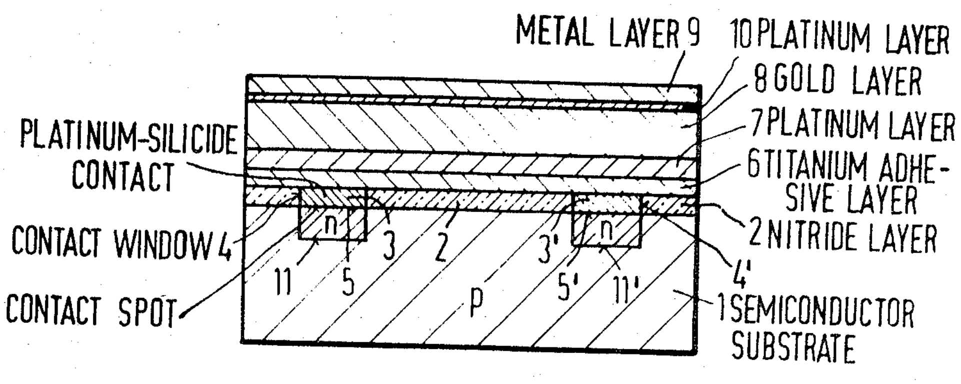

METHOD OF PRODUCING INTEGRATED CIRCUITS

DESCRIPTION OF THE INVENTION

The invention relates to a method of producing integrated circuits. More particularly, the invention relates to a method of producing integrated circuits in a semiconductor substrate having semiconductor circuit components therein and platinum contact spots. A layer of insulating material covers the surface of the semiconductor substrate having the contact spots, but does not cover said contact spots. A titanium layer covers the insulating layer. A platinum layer covers the titanium layer and a gold layer covers the platinum layer.

As described in the "Bell Telephone Laboratory Record," Oct.-Nov., 1966, and in the "Western Electric Engineer," Dec., 1957, it is known to provide conducting pattern or beam leads in a layer sequence of titanium-platinum-gold, on a silicon semiconductor substrate. To accomplish this, after the diffusion process, the original silicon semiconductor substrate is provided with a nitride-passivated layer having a thickness of approximately 1,000 to 1,500 A. Contact holes are subsequently etched in the material extending to the silicon and the wafer is then dusted over its entire area with a platinum layer. Short term heat treatment then forms platinum silicide in the contact holes. The platinum layer is then etched off. The platinum silicide in the contact holes is not adversely affected thereby. Thereafter, titanium and platinum are applied by sputtering over the entire original semiconductor body. The platinum pattern is subsequently etched free via photomasking. Titanium remains for contacting the gold galvanized reinforcement. After the titanium is etched off, the original semiconductor body may be prepared for separation etching of the individual systems.

The titanium serves as an adhesive layer and the platinum serves as a blocking or barrier layer to separate the gold from the titanium and the silicon. The masking process is a photovarnish process. The difficulties which thus arise are caused by gold galvanization, which is difficult to accomplish for fine structures whose order of magnitude is approximately 5 microns. In addition, the chemical etching of platinum is difficult to reproduce.

The principal object of the invention is to provide a new and improved method of producing integrated circuits.

An object of the invention is to provide a method of producing integrated circuits, which method overcomes the disadvantages of known methods.

An object of the invention is to provide a method of producing integrated circuits, which method provides very fine structure of gold conducting patterns.

An object of the invention is to provide a method of producing integrated circuits, which method is efficient, effective and reliable.

In accordance with the invention, a method of producing integrated circuits, in which a semiconductor substrate having semiconductor structural components therein and platinum contact spots at one surface of the substrate has a layer of insulating material covering the one surface of the substrate except the contact spots, a titanium layer covering the layer of insulating material and the contact spots, a platinum layer covering the titanium layer, a gold layer covering the platinum layer, comprises applying a chemically easily etchable metal masking layer to the gold layer, chemically etching away the metal masking layer except for a desired conductor pattern, etching away the gold layer and the platinum layer other than the desired conductor pattern by cathode sputtering, etching away the metal masking layer remaining on the desired conductor pattern, and etching away the titanium layer other than the desired conductor pattern.

The metal masking layer may comprise titanium, aluminum, or one of the group consisting of molybdenum, chromium, hafnium, zirconium, vanadium, tungsten and tantalum.

The semiconductor substrate comprises silicon.

An additional platinum layer may be provided over the gold layer prior to applying the metal masking layer.

The metal masking layer is applied to the gold layer by cathode sputtering in a vacuum. The vacuum may constitute an atmosphere comprising a gas having a pressure of approximately $10^{-3}$ Torr and consisting of 95 percent argon and 5 percent nitrogen. The vacuum may constitute an atmosphere comprising a gas having a pressure of approximately $10^{-3}$ Torr and consisting of 95 percent argon and 5 percent oxygen.

The metal masking layer permits the production of very fine patterns of gold. Reactive material is preferably utilized as the metal masking layer. The reactive material has the lowest possible sputtering rate and may be utilized for many masking purposes during ion etching. The sputtering rates of the masking materials are approximately two to three times lower than those of gold or platinum. This difference may be further increased by adding nitrogen or oxygen to the sputtering argon gas, and especially by means of DC sputtering.

The advantage of the additional layer of platinum over the gold layer is that said additional platinum layer avoids direct contact between the material of the masking layer and the gold layer. This is expedient in the subsequent chemical etching of the masking layer.

In order that the invention may be readily carried into effect, it will now be described with reference to the accompanying drawing, wherein the single FIGURE is a schematic sectional diagram of an embodiment of the semiconductor substrate and its various layers, as operated on by the method of the invention.

A semiconductor substrate 1 preferably comprises silicon. The semiconductor substrate 1 has a nitride-passivated marginal layer 2 covering a surface thereof. The semiconductor substrate 1 includes individual structural components or circuits such as, for example, diodes 11 and 11', and also includes scratch paths or patterns which are not shown in the drawing in order to maintain the clarity of illustration.

Platinum silicide contacts 3 and 3' are provided at the surface of the semiconductor substrate 1 and are not covered by the nitride layer 2. The platinum silicide contacts 3 may be produced by etching in contact windows 4 and 4', sputtering platinum after the etching of said contact windows, and then etching away the platinum beyond the contact spots 5 and 5'.

Without interrupting a vacuum in which the substrate 1 is placed, a multitarget high-frequency sputtering apparatus is utilized to produce a sequence of an adhesive layer 6 of titanium having a thickness of approximately 1,000 A., a platinum layer 7 covering the titanium layer 6 and having a thickness of approximately 1,500 A., for separating the gold from the titanium and silicon, and a layer of gold 8 covering the platinum layer 7 and having a thickness of approximately 5,000 to 10,000 A. The gold layer 8 is utilized as the conducting material to provide the conductance pattern which is to be produced by ion etching. The gold layer 8 is of sufficiently low ohmic resistance.

The foregoing sputtering process may be utilized to provide an additional platinum layer 10 over the gold layer 8. The additional platinum layer 10 has a thickness of approximately 500 A. and is utilized to separate the gold 8 from the masking material. Finally, a layer 9 of masking material is provided by the sputtering process and covers the additional platinum layer 10. The masking layer has a thickness of approximately 3,000 A. The masking layer 9 comprises a suitable masking metal such as, for example, titanium, aluminum, molybdenum, chromium, hafnium, zirconium, vanadium, tungsten or tantalum. The masking layer 9 is sputtered on for the subsequent ion etching of the conductive material.

The indicated thicknesses of the various layers have been found to be variable. The application of the additional platinum layer 10 is not absolutely necessary. It has been found that it is primarily expedient to utilize either aluminum or titanium for the masking layer 9.

After the application of the various metal layers to the semiconductor substrate 1 and its layer 2 of electrically insulating material, the conductive pattern is chemically etched, in a known manner, into the masking layer 9, for the entire structural component. A phototechnique is utilized. Since the masking layer 9 is very thin, structures under 4 microns are easy to produce. The semiconductor body is then ion etched in a cathode-sputtering apparatus, by utilizing the masking layer 9. Simultaneously, and has a result of the etching process, the additional platinum layer 10, the gold layer 8 and the platinum layer 7 beyond the masking structure are removed.

In a preferred embodiment of the invention, about 5 percent nitrogen or 5 oxygen is added to the argon which is utilized as the sputtering gas. This may increase the difference in the sputtering rates between gold or platinum, on the one hand, and aluminum, titanium or molybdenum, on the other hand, from a factor of 2 or 3, up to a factor of 10. The vacuum utilized is preferably about $10^{-3}$ Torr.

The masking layer 9 may comprise chromium, tantalum, hafnium, zirconium, vanadium or tungsten, as hereinbefore mentioned. Such material is preferably applied in a vacuum, in a cathode-sputtering process.

In accordance with the invention, reactive, chemically easily etchable material is utilized for the masking layer 9. The addition of nitrogen or oxygen to the argon-sputtering gas reduces the sputtering rate of the masking material.

The remaining material of the masking layer 9 and the titanium layer 6 are subsequently chemically etched away in a known manner. The titanium layer 6 outside the conductive pattern is etched away.

The method of the invention is particularly preferable for use with a silicon semiconductor substrate. The semiconductor substrate may, however, comprise another suitable semiconductor material such as, for example, germanium.

While the invention has been described by means of a specific example and in a specific embodiment, I do not wish to be limited thereto, for obvious modifications will occur to those skilled in the art without departing from the spirit and scope of the invention.

I claim:

1. A method of producing integrated circuits in which a semiconductor substrate having semiconductor structural components therein and platinum contact spots at one surface of said substrate has a layer of insulating material covering said one surface of said substrate except said contact spots, a titanium layer covering the layer of insulating material and the contact spots, a platinum layer covering the titanium layer, a gold layer covering the platinum layer, said method comprising applying a chemically easily etchable metal masking layer to said gold layer;

chemically etching away the metal masking layer except for a desired conductor pattern;

etching away the gold layer and the platinum layer other than the desired conductor pattern by cathode sputtering;

etching away the metal masking layer remaining on the desired conductor pattern; and etching away the titanium layer other than the desired conductor pattern.

2. A method as claimed in claim 1, wherein the metal masking layer comprises titanium.

3. A method as claimed in claim 1, wherein the metal masking layer comprises aluminum.

4. A method as claimed in claim 1, wherein the metal masking layer comprises one of the group consisting of molybdenum, chromium, hafnium, zirconium, vanadium, tungsten and tantalum.

5. A method as claimed in claim 1, wherein the semiconductor substrate comprises silicon.

6. A method as claimed in claim 1, further comprising applying an additional platinum layer over the gold layer prior to applying the metal masking layer.

7. A method as claimed in claim 1, wherein the metal masking layer is applied to the gold layer by cathode sputtering in a vacuum.

8. A method as claimed in claim 7, wherein the vacuum constitutes an atmosphere comprising a gas having a pressure of approximately $10^{-3}$ Torr and consisting of 95 percent argon and 5 percent nitrogen.

9. A method as claimed in claim 7, wherein the vacuum constitutes an atmosphere comprising a gas having a pressure of approximately $10^{-3}$ Torr and consisting of 95 percent argon and 5 percent oxygen.

* * * * *